United States Patent [19]
Satoh

[11] Patent Number: 5,880,635
[45] Date of Patent: Mar. 9, 1999

[54] APPARATUS FOR OPTIMIZING THE PERFORMANCE OF A POWER AMPLIFIER

[75] Inventor: Naotaka Satoh, San Diego, Calif.

[73] Assignees: Sony Corporation, Tokyo, Japan; Sony Electronics, Inc., Park Ridge, N.J.

[21] Appl. No.: 839,882

[22] Filed: Apr. 16, 1997

[51] Int. Cl.[6] .................................................. H03G 3/20
[52] U.S. Cl. ........................................ 330/144; 330/284
[58] Field of Search .................................... 330/129, 144, 330/145, 279, 284

[56] References Cited

U.S. PATENT DOCUMENTS 5,673,001  9/1997  Kim et al. .............................. 330/284

*Primary Examiner*—Steven Mottola
*Attorney, Agent, or Firm*—Frommer Lawrence & Haug, LLP.; William S. Frommer

[57] ABSTRACT

The performance of a power amplifier used in a signal transmitter, such as in a communication system (e.g., a personal communication system PCS), is optimized by coupling a controllable impedance to the output impedance of the power amplifier. The power output level of the amplifier, which is variable over a range from a minimum level to a maximum level and which is accompanied by a corresponding amplifier output impedance change, is detected, as is the operating power supplied to the amplifier. The controllable impedance that is coupled to the amplifier output is controlled as a function of the detected amplifier power output level and sensed operating power.

9 Claims, 7 Drawing Sheets

| OPERATING SUPPLY INDICATING SIGNAL (dBm) | POWER LEVEL INDICATING SIGNAL (dBm) | $C_1$ (pf) | Vctl (V) |
|---|---|---|---|
| -104 | +23 | 30 | 3.0 |
| -100 | +23 | 20 | 2.0 |
| -90 | +20 | 20 | 2.0 |
| -80 | +10 | 15 | 1.5 |
| -70 | 0 | 15 | 1.5 |
| -60 | -10 | 10 | 1.0 |
| -50 | -20 | 10 | 1.0 |

FIG. 4A

| OPERATING SUPPLY INDICATING SIGNAL (dBm) | POWER LEVEL INDICATING SIGNAL (dBm) | L₁ (μH) | $V_{gg}$ (V) |
|---|---|---|---|
| -104 | +23 | 0.5 | 0.2 |
| -100 | +23 | 1.0 | 0.3 |
| -90 | +20 | 1.0 | 0.3 |
| -80 | +10 | 2.0 | 0.5 |
| -70 | 0 | 2.0 | 0.5 |
| -60 | -10 | 2.5 | 0.6 |
| -50 | -20 | 2.5 | 0.6 |

FIG. 4B

| OPERATING SUPPLY INDICATING SIGNAL (dBm) | POWER LEVEL INDICATING SIGNAL (dBm) | $C_1$ (pf) | $V_{ctl}$ (V) | $L_1$ (μH) | $V_{gg}$ (V) |
|---|---|---|---|---|---|
| -104 | +23 | 30 | 3.0 | 0.5 | 0.2 |
| -100 | +23 | 20 | 2.0 | 1.0 | 0.3 |
| -90 | +20 | 20 | 2.0 | 1.0 | 0.3 |
| -80 | +10 | 15 | 1.5 | 2.0 | 0.5 |
| -70 | 0 | 15 | 1.5 | 2.0 | 0.5 |
| -60 | -10 | 10 | 1.0 | 2.5 | 0.6 |
| -50 | -20 | 10 | 1.0 | 2.5 | 0.6 |

FIG. 4C

APPARATUS FOR OPTIMIZING THE PERFORMANCE OF A POWER AMPLIFIER

BACKGROUND OF THE INVENTION

This invention relates to signal transmitters and, more particularly, to apparatus for optimizing the performance of a power amplifier in a signal transmitter.

Power amplifiers are used in communication systems, such as signal transmitters or transceivers, for amplifying signals to be transmitted. For example, power amplifiers are used in radio transmitters, cellular telephone transmitters, personal communication systems (PCS) and the like. In a typical signal transmission application, such as in a PCS, the signal to be transmitted, such as a speech signal, is modulated onto an RF carrier and then is transmitted from, for example, a cellular telephone to a base station. During a typical transmission session, as when speech or digital signals are transmitted by the RF carrier, the power amplifier output level varies over a range from a minimum output level to a maximum output level. As a numerical example, the output power generated from the power amplifier may vary from practically zero to an output power level on the order of about 600 milliwatts (mw).

For optimal power consumption by the power amplifier, the load impedance thereof should be matched to the power output level. Heretofore, it had been thought that it would be quite difficult and expensive to couple a variable load impedance to the power amplifier and to control that load impedance such that it is matched to the amplifier output impedance, yet varies as a function of the power amplifier output level. Hence, it has been common to fix the power amplifier load impedance at a predetermined value which, for the most part, is expected to match the power amplifier output level within an accepted tolerance range. However, when the output power generated by this amplifier is outside the range for which the load impedance has been designed, power consumption by the power amplifier may be much greater than necessary, thereby exerting a significant drain on the battery which may be used as the power source.

OBJECTS OF THE INVENTION

Therefore, it is an object of the present invention to provide a circuit which optimizes the performance of a power amplifier in a signal transmitter.

Another object of this invention is to provide apparatus which minimizes the power consumed by a power amplifier even as the power output level of that amplifier varies over a range from minimum to maximum power levels.

Still another object of this invention is to optimize the performance of a PCS power amplifier by reducing the current consumed by that power amplifier even though the power output level of the amplifier varies.

A still further object of this invention is to provide apparatus for optimizing the performance of a power amplifier in a PCS by changing the operating supply voltage to the amplifier in accordance with changes in the power output produced by that amplifier.

Various other objects, advantages and features of the present invention will become readily apparent from the ensuing detailed description, and the novel features will be particularly pointed out in the appended claims.

SUMMARY OF THE INVENTION

In accordance with this invention, apparatus is provided for optimizing the performance of a power amplifier in a signal transmitter, such as a power amplifier used in a PCS. An adjustable matching circuit having a controllable impedance is coupled to the output impedance of the power amplifier, the controllable impedance being adjusted as a function of the power output level of the amplifier and the operating power supplied to that amplifier.

As a feature of this invention, a power detector is coupled to the output of the power amplifier to detect the power output level thereof and to produce a power level indicating signal. An operating power sensor detects the operating power supplied to the power amplifier, e.g., the current supplied thereto from a power supply, and produces an operating supply signal indicative of the operating power. An impedance control circuit is coupled to the power detector and to the operating power sensor so as to control the controllable impedance of the matching circuit as a function of the power level indicating signal and the operating supply indicating signal.

In one embodiment of this invention, the matching circuit includes a voltage-controlled capacitance, such as a varicap diode. In another embodiment, the matching circuit includes a field effect transistor whose output impedance is adjusted by the impedance control circuit. In yet a further embodiment, the matching circuit includes both a voltage-controlled capacitance and an FET.

As one aspect of the invention, when used in, for example, a transceiver, such as a cellular telephone, a personal communication system, or the like, the operating power supplied to the power amplifier is sensed by a current detector or by the amplitude of a received signal. As another aspect, the operating power supplied to the power amplifier is sensed by a voltage controller which supplies to the power amplifier a controllable operating voltage which increases when the output power level increases and decreases when the output power level decreases, such that the operating supply indicating signal produced by the voltage controlling circuit is representative of the operating voltage supplied to the power amplifier.

As a further aspect of this invention, the power detecting circuit comprises a capacitor coupled to the power amplifier output so as to produce a voltage that is a function of the output power level of the amplifier. As an additional aspect, the power detecting circuit is implemented by a directional coupler.

In a preferred embodiment, the impedance control circuit comprises a processor and a look-up table, the latter storing impedance control values that are associated with respective power level and operating supply indicating signals. The processor uses the power level and operating supply indicating signals produced by the power detecting and operating power sensing circuits to produce an address for addressing the look-up table and thereby read out therefrom the appropriate impedance control value.

BRIEF DESCRIPTION OF THE DRAWINGS

The following detailed description, given by way of example and not intended to limit the present invention solely thereto, will best be understood in conjunction with the accompanying drawings in which:

FIGS. 4A–4C are schematic representations of look-up tables which may be included in the impedance controller of the present invention.

DETAILED DESCRIPTION OF PREFERRED EMBODIMENTS

Figure 1:
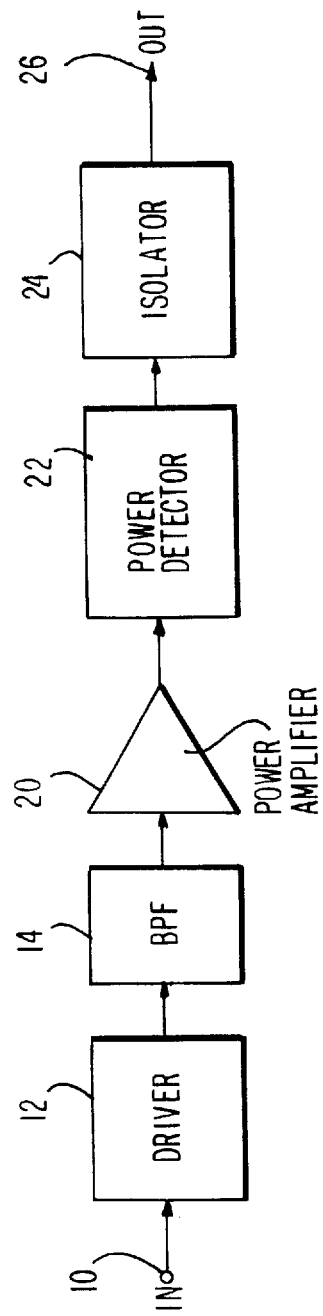
FIG. 1 is a block diagram of a prior art signal transmitter of the type used in, for example, a PCS.

Before describing one embodiment of the present invention, reference is made to FIG. 1 which is a block diagram of a prior art signal transmitter that may be used in a personal communication system (PCS) such as a cellular telephone, a radio transmitter, a paging system or the like. As shown in FIG. 1, an input signal, which may be a speech signal, a digital signal, or the like, modulated onto an RF carrier is supplied to a power amplifier 20 from an input terminal 10 by way of an amplifier driver 12 and a band pass filter 14. The power amplifier amplifies the signal supplied thereto to suitable power levels, such as on the order of about 600 milliwatts, and the amplified signal is coupled to an output terminal 26 by way of a power detector 22 and an isolator 24. The power detector senses if the output power is too high, as may arise if the transmitter has failed, to shut down the transmitter, for example, by interrupting the power supply output (not shown). Once supplied to output terminal 26, the amplified signal is coupled to an antenna (not shown), such as by way of a duplexer (also not shown), thereby permitting the antenna to be used for both transmission and reception. The duplexer (not shown) additionally is coupled to a signal receiving circuit for receiving and processing a signal received by the antenna (not shown) from a remote location. It is appreciated, therefore, that FIG. 1 simply illustrates the signal transmission circuit of a typical transceiver.

It is expected that during a typical transmission operation, such as when speech signals are transmitted from a cellular telephone which incorporates the transmitter shown in FIG. 1, the output power level of power amplifier 20 varies over a range from a minimum level, such as slightly more than 0 milliwatts to a maximum level which has been assumed herein to be on the order of about 600 milliwatts. The power amplifier itself is a conventional device having an input, or source, impedance of very low value and an output impedance which, as is known, varies as a function of the power output level of the power amplifier. This output impedance, also referred to as a load impedance, thus changes with the power output level, and as a result, the current supplied to the power amplifier from the power supply (not shown) likewise changes. Stated otherwise, the power consumption of power amplifier 20 varies as a function of the power output level thereof.

In the prior art arrangement shown in FIG. 1, it is difficult to optimize the power consumed by power amplifier 20 because the load impedance thereof changes as the power output level changes and this, in turn, affects the power consumption. The present invention proceeds on the principal that the load impedance of power amplifier 20 should be adjusted as a function of the power output level of the power amplifier and also as a function of the power consumed by the power amplifier. Such adjustments in the load impedance are intended to compensate for changes in the power amplifier output impedance, thereby minimizing the amount of power consumed by the power amplifier during periods of low power output of the signal transmitter. One embodiment of the present invention is illustrated in FIG. 2, wherein the same reference numerals are used to identify the same elements shown in FIG. 1.

Figure 2:
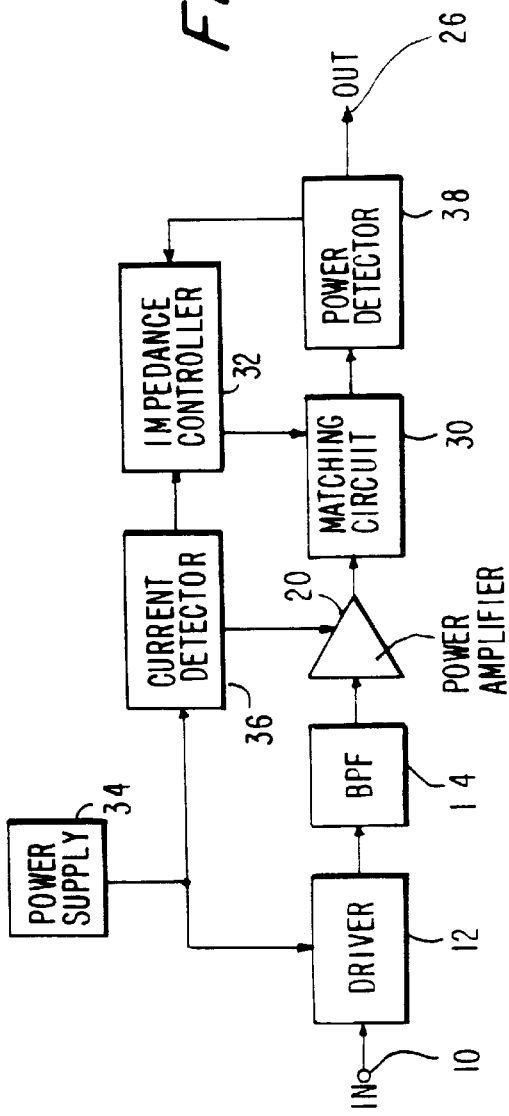
FIG. 2 is a block diagram of a signal transmitter in which one embodiment of the present invention is incorporated.

In FIG. 2, power amplifier 20 is coupled to a matching circuit 30 which exhibits a controllable impedance the value of which is controlled by an impedance controller 32. The impedance controller is adapted to control the impedance of the matching circuit as a function of the power output produced by power amplifier 20 as well as the operating power supplied to the power amplifier. In this regard, power is supplied to amplifier 20 by a power supply 34, such as a battery, and the amount of operating power so supplied to the amplifier is sensed by a current detector 36. For example, the current detector may comprise a simple sense resistor which develops a sense voltage thereacross as a function of the current supplied to power amplifier 20 from power supply 34. Thus, as the operating power varies, the voltage produced by current detector 36 likewise varies. This sense voltage is used as an operating supply indicating signal which indicates the operating power supplied to and, thus, consumed by power amplifier 20. As illustrated in FIG. 2, the operating supply indicating signal is coupled to impedance controller 32.

The power output level of power amplifier 20 is detected by a power detector 38 which, in turn, produces a power level signal indicative of the detected output power level. This power level indicating signal is coupled to impedance controller 32.

In operation, as the power output level produced by power amplifier 20 changes, the output impedance of the power amplifier also changes. As a result, the operating power supplied to the power amplifier, and particularly the current consumed by the power amplifier, also changes. Current detector 36 senses the current consumed by the power amplifier and power detector 38 detects the power output level of the power amplifier. The operating supply indicating signal produced by current detector 36 and the power level indicating signal produced by power detector 38 are coupled to impedance controller 32 which, in turn, controls the impedance of matching circuit 30 as a function of the power level and operating supply indicating signals. Accordingly, the controllable impedance of the matching circuit, which is coupled to the output impedance of power amplifier 20, changes to compensate for changes in the amplifier output impedance, thereby optimizing the amount of current consumed by the power amplifier. This results in prolonging the effective life of the battery which constitutes power supply 34.

Figure 2A:
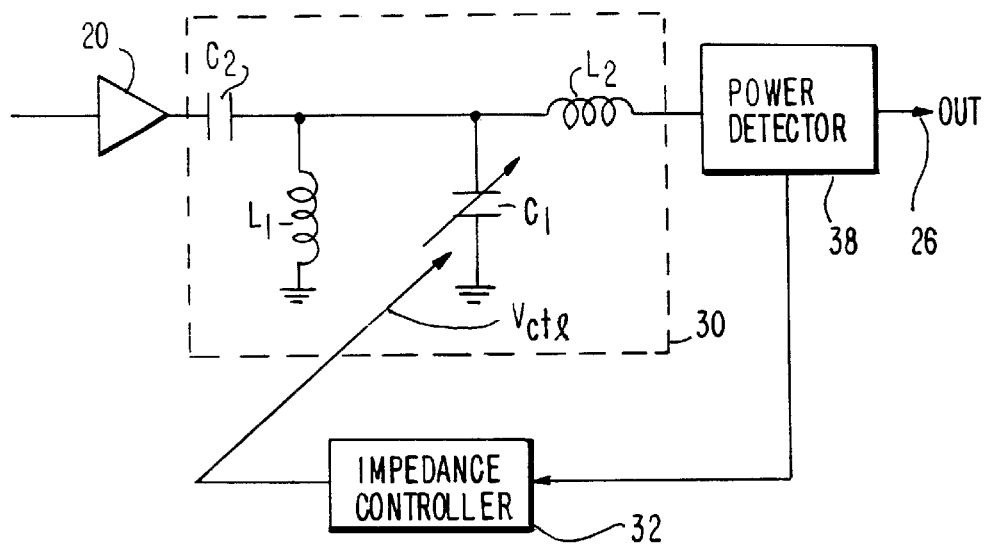
FIGS. 2A–2E are circuit diagrams representing different embodiments of the matching circuit and the power detector shown in FIG. 2.

One embodiment of matching circuit 30 is illustrated in FIG. 2A. Here, the matching circuit is formed as an LC circuit including a voltage-controlled capacitance $C_1$, such as a varicap diode, inductances $L_1$ and $L_2$, and capacitance $C_2$. As shown in FIG. 2A, the effective capacitance $C_1$ of the varicap diode is controlled by impedance controller 32; and as the effective capacitance changes, the load impedance coupled to the output of power amplifier 20 likewise changes. Hence, variations in the output impedance of the power amplifier due to changes in the output power level thereof are compensated by the varicap diode.

Figure 2B:
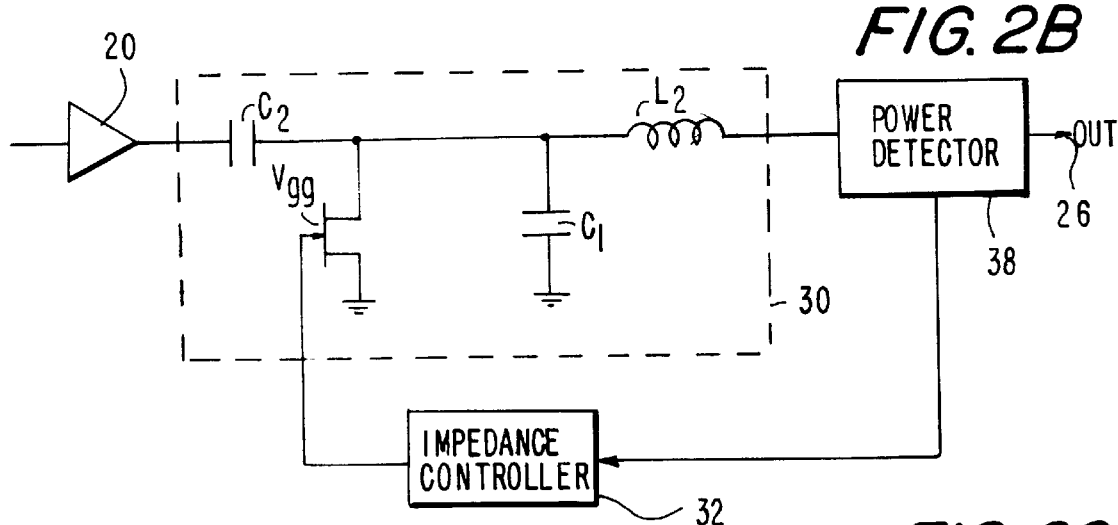

Another embodiment of matching circuit 30 is illustrated in FIG. 2B wherein a field effect transistor (FET), is used as a variable inductance. As shown, the source-drain impedance of the FET is controlled by a gate signal $V_{gg}$ supplied by impedance controller 32. The source-drain impedance acts as a load impedance to the power amplifier; and it is appreciated that this load impedance is adjusted to compensate for changes in the amplifier output impedance arising from changes in the power output level.

Figure 2C:
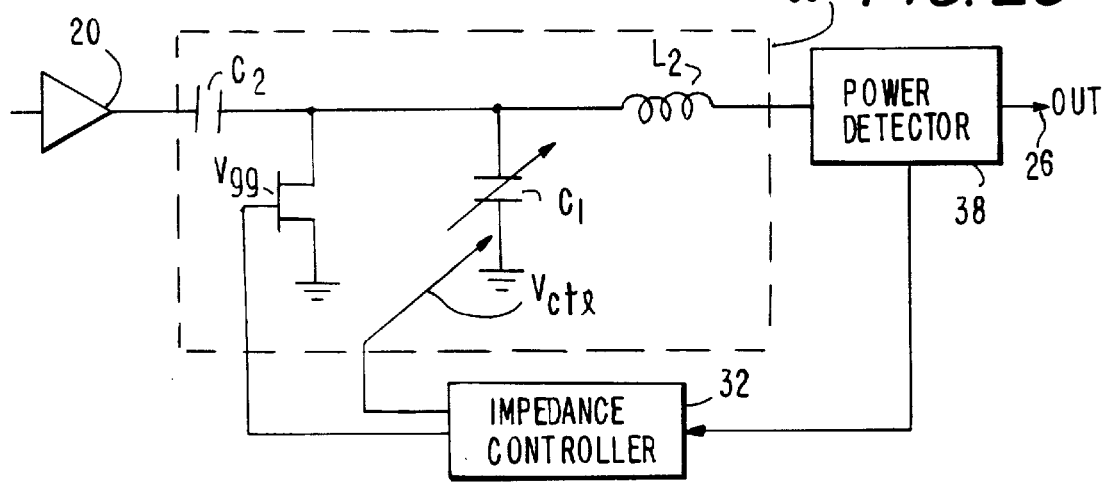

FIG. 2C illustrates yet another embodiment of matching circuit 30, formed of both voltage controlled capacitance $C_1$ and the FET which, as before, functions as a variable inductance.

Figure 2D:
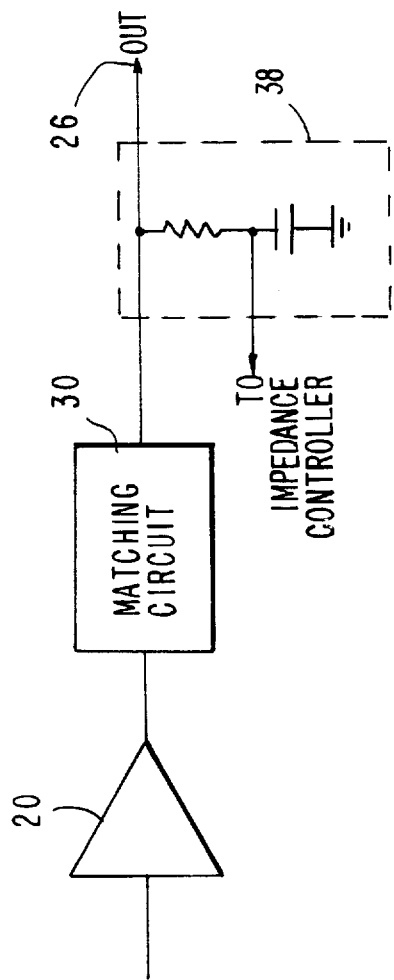

FIG. 2D illustrates one embodiment of power detector 38, which here is seen to include a capacitance. Output current from power amplifier 20 is directly related to the power output level thereof; and this output current charges the capacitance so as to produce a voltage level thereacross corresponding to the power output level. The voltage thus produced across the capacitance of power detector 38 is supplied to impedance controller 32 as the aforementioned power level indicating signal.

Figure 2E:
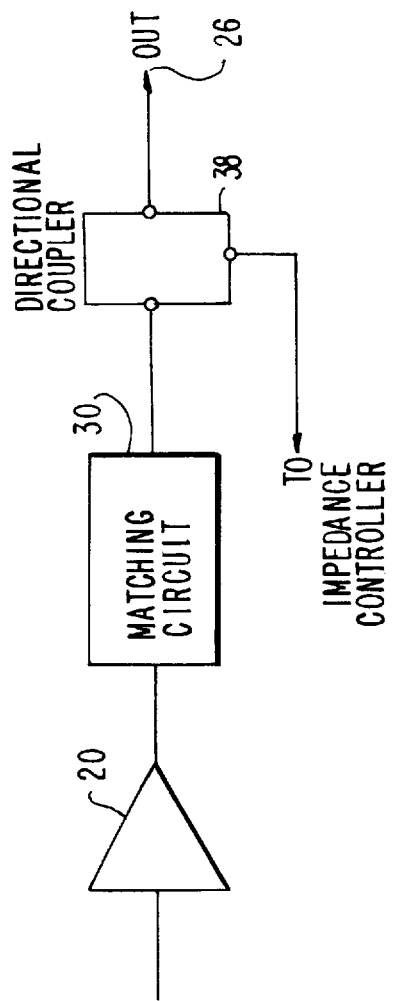

Still another embodiment of power detector 38 is illustrated in FIG. 2E as comprising a directional coupler. Directional couplers are known three-port devices, including an input port coupled to receive the power output from power amplifier 20, a power output port coupled to output terminal 26 to supply the amplified signal thereto, and a measuring output port which provides an indicating signal proportional to the power signal supplied to the power output port. This indicating signal is coupled to impedance controller 32 as the power level indicating signal.

Figure 3:
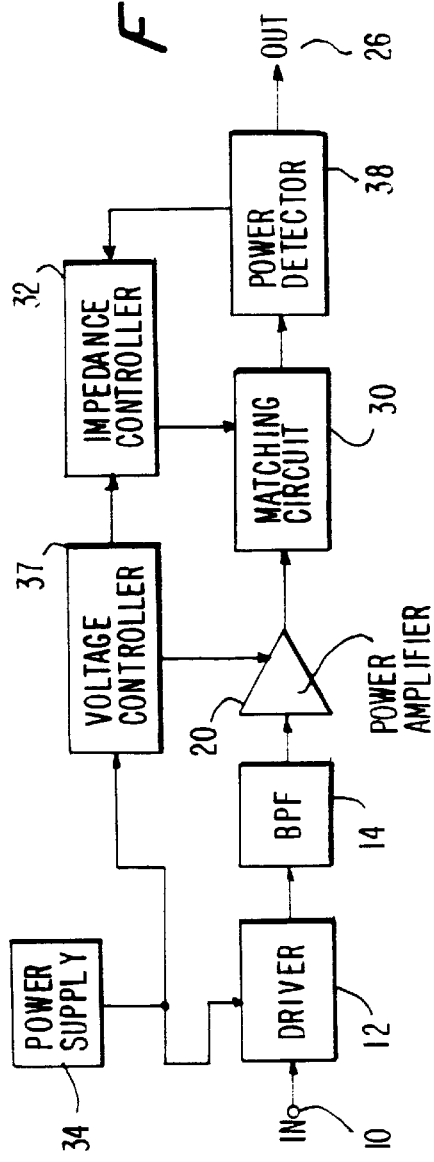
FIG. 3 is a block diagram of another embodiment of a signal transmitter incorporating the present invention.

In the embodiment shown in FIG. 2, power consumed by power amplifier 20 is sensed by current detector 36 which senses the current supplied to the power amplifier from power supply 34. In the alternative embodiment shown in FIG. 3, a voltage controller 37 is coupled to power supply 34 and is adapted to supply an operating voltage to the power amplifier. Voltage controller 37 may comprise a conventional device to supply an increased operating voltage to the power amplifier when the power output level of the power amplifier increases, and to supply a reduced operating voltage when the power output level of the power amplifier decreases. A signal representing this changing operating voltage is coupled to impedance controller 32 as the aforementioned operating supply indicating signal.

In a preferred embodiment, impedance controller 32 includes a processor, such as a CPU and a look-up table. The look-up table may comprise a ROM, such as an EPROM which stores therein, for discrete values of the power level indicating signal produced by power detector 38 and for discrete values of the operating supply indicating signal produced by current detector 36 (or voltage controller 37) respective impedance control values. Schematic representations of suitable look-up tables are illustrated in FIGS. 4A–4C. For example, for the embodiment of matching circuit 30 shown in FIG. 2A, the variable capacitance may be controlled by a control voltage Vct1 produced by impedance controller 32 so as to exhibit the controlled impedance $C_1$ shown in FIG. 4A. Likewise, for the embodiment of the matching circuit shown in FIG. 2B, the variable inductance, or equivalent source-drain FET impedance, may be controlled by a control voltage $V_{gg}$ produced by the impedance controller so as to exhibit the controlled impedance $L_1$ shown in FIG. 4B. And for the embodiment of matching circuit 30 shown in FIG. 2C, the variable capacitance and FET impedance may be controlled by the control voltages $V_{ctl}$ and $V_{gg}$ to exhibit the controlled impedance $C_1$ and $L_1$ shown in FIG. 4C. The look-up tables schematically illustrated in FIGS. 4A–4C depict the relationship between the power level and operating supply indicating signals on the one hand and the controlled impedance of matching circuit 30 on the other.

In another embodiment, the power level and operating supply indicating signals are supplied in or converted to digital form, and such digital signals are used as addresses to address the look-up table and retrieve therefrom the impedance control values, or control voltages $V_{ctl}$, $V_{gg}$ which, in turn, adjust the impedance of matching circuit 30 as a function of the retrieved impedance control values.

While the present invention has been particularly shown and described with reference to preferred embodiments, it will be readily appreciated by those of ordinary skill in the art that various changes may be made without departing from the spirit and scope of the invention. It is intended that the appended claims be interpreted as including the embodiments that have been described specifically herein, those modifications which would become apparent to one of ordinary skill in the art and all equivalents thereto.

What is claimed is:

1. Apparatus for optimizing the performance of a power amplifier in a signal transmitter, comprising:

a power amplifier supplied with operating power for amplifying a signal to be transmitted, said power amplifier having a source impedance and an output impedance and exhibiting a power output level that is variable over a range from a minimum level to a maximum level, and wherein said output impedance changes as said power output level varies;

an adjustable matching circuit coupled to said output impedance of said power amplifier and exhibiting a controllable impedance which comprises controllable inductance means;

power detecting means coupled to an output of said power amplifier for detecting said power output level and for producing a power level indicating signal indicative of the detected power output level;

operating power sensing means for detecting the operating power supplied to said power amplifier and for producing an operating supply indicating signal indicative of the operating power supplied to said power amplifier; and impedance control means coupled to said power detecting means and to said operating power sensing means for controlling said controllable impedance of said matching circuit as a function of said power level and operating supply indicating signals.

2. Apparatus for optimizing the performance of a power amplifier in a signal transmitter, comprising:

a power amplifier supplied with operating power for amplifying a signal to be transmitted, said power amplifier having a source impedance and an output impedance and exhibiting a power output level that is variable over a range from a minimum level to a maximum level, and wherein said output impedance changes as said power output level varies;

an adjustable matching circuit coupled to said output impedance of said power amplifier and exhibiting a controllable impedance, said matching circuit including a field effect transistor (FET) having an output impedance;

power detecting means coupled to an output of said power amplifier for detecting said power output level and for producing a power level indicating signal indicative of the detected power output level;

operating power sensing means for detecting the operating power supplied to said power amplifier and for producing an operating supply indicating signal indicative of the operating power supplied to said power amplifier; and impedance control means coupled to said power detecting means and to said operating power sensing means for controlling said controllable impedance of said matching circuit as a function of said power level and operating supply indicating signals; said impedance control means being operable to supply a control signal to said FET to adjust the output impedance thereof.

3. The apparatus of claim 1 wherein said operating power sensing means comprises current detector means for detecting operating current supplied to said power amplifier from a power supply source.

4. Apparatus for optimizing the performance of a power amplifier in a signal transmitter, comprising:

a power amplifier supplied with operating power for amplifying a signal to be transmitted, said power amplifier having a source impedance and an output impedance and exhibiting a power output level that is variable over a range from a minimum level to a maximum level, and wherein said output impedance changes as said power output level varies;

an adjustable matching circuit coupled to said output impedance of said power amplifier and exhibiting a controllable impedance;

power detecting means coupled to an output of said power amplifier for detecting said power output level and for producing a power level indicating signal indicative of the detected power output level;

operating power sensing means for detecting the operating power supplied to said power amplifier and for producing an operating supply indicating signal indicative of the operating power supplied to said power amplifier; said operating power sensing means comprising voltage controlling means for supplying a controllable operating voltage to said power amplifier such that said operating voltage increases when said power output level increases and said operating voltage decreases when said power output level decreases, and said operating supply indicating signal is representative of the operating voltage supplied to said power amplifier; and impedance control means coupled to said power detecting means and to said operating power sensing means for controlling said controllable impedance of said matching circuit as a function of said power level and operating supply indicating signals.

5. Apparatus for optimizing the performance of a power amplifier in a signal transmitter, comprising:

a power amplifier supplied with operating power for amplifying a signal to be transmitted, said power amplifier having a source impedance and an output impedance and exhibiting a power output level that is variable over a range from a minimum level to a maximum level, and wherein said output impedance changes as said power output level varies;

an adjustable matching circuit coupled to said output impedance of said power amplifier and exhibiting a controllable impedance;

power detecting means coupled to an output of said power amplifier for detecting said sower output level and for producing a power level indicating signal indicative of the detected power output level, said power detecting means comprising capacitor means coupled to said power amplifier output for producing a voltage as a function of said power output level;

operating sower sensing means for detecting the operating power supplied to said power amplifier and for producing an operating supply indicating signal indicative of the operating sower supplied to said power amplifier; and impedance control means coupled to said power detecting means and to said operating power sensing means for controlling said controllable impedance of said matching circuit as a function of said power level and operating supply indicating signals.

6. The apparatus of claim 4 wherein said power detecting means comprises a directional coupler having an input port coupled to said power amplifier output, a power output port for providing the amplified signal to be transmitted and an indicating signal port for providing said power level indicating signal as a function of the power amplifier output.

7. The apparatus of claim 4 wherein said impedance control means comprises a processor and a look-up table, said look-up table storing impedance control values associated with respective power level and operating supply indicating signals, and said processor uses the power level and operating supply indicating signals produced by said power detecting and operating power sensing means to produce an address for addressing said look-up table.

8. The apparatus of claim 4 wherein said matching circuit includes a voltage-controlled capacitance and said impedance control means is operable to supply a control voltage to said voltage-controlled capacitance as a function of said power level and operating supply indicating signals.

9. The apparatus of claim 8 wherein said voltage-controlled capacitance comprises a varicap diode.

* * * * *